US008678028B2

(12) United States Patent
Roder et al.

(10) Patent No.: US 8,678,028 B2
(45) Date of Patent: Mar. 25, 2014

(54) LOCKING DEVICE

(75) Inventors: Mario Roder, Gelnhausen (DE);
Alexander Muller, Hasselroth (DE);
Andreas Caspari, Seligenstadt (DE);
Thomas Vogt, Grosskrotzenburg (DE);
Christof Klesen, Modautal (DE)

(73) Assignee: Leybold Optics GmbH (DE)

( * ) Notice: Subject to any disclaimer, the term of this patent is extended or adjusted under 35 U.S.C. 154(b) by 0 days.

(21) Appl. No.: 11/596,787

(22) PCT Filed: May 31, 2005

(86) PCT No.: PCT/EP2005/005825
§ 371 (c)(1),
(2), (4) Date: Jan. 30, 2008

(87) PCT Pub. No.: WO2005/121621
PCT Pub. Date: Dec. 22, 2005

(65) Prior Publication Data
US 2008/0271501 A1   Nov. 6, 2008

(30) Foreign Application Priority Data

Jun. 8, 2004 (DE) .......................... 10 2004 027 752

(51) Int. Cl.
*F16K 21/18* (2006.01)
(52) U.S. Cl.
USPC ....... 137/383; 251/129.21; 251/193; 251/301
(58) Field of Classification Search
USPC .............. 137/383, 384.6, 384.8, 385; 251/65, 251/158, 193, 129.21, 326, 89, 129.01, 251/129.15, 301
See application file for complete search history.

(56) References Cited

U.S. PATENT DOCUMENTS

| 2,556,225 | A |   | 6/1951  | Serge                      |
|-----------|---|---|---------|----------------------------|
| 2,952,802 | A | * | 9/1960  | Michelson ......... 335/281 |
| 3,247,833 | A | * | 4/1966  | Beddoes et al. ..... 123/470 |
| 3,550,717 | A | * | 12/1970 | Doty, Jr. ............. 180/284 |
| 3,665,958 | A |   | 5/1972  | Dunkelis                   |

(Continued)

FOREIGN PATENT DOCUMENTS

| DE | 37 24 465   | 1/1988 |
| DE | 3724465 A1  | 1/1988 |

(Continued)

OTHER PUBLICATIONS

International Search Report; PCT/EP2005/005825; Aug. 26, 2005.

(Continued)

*Primary Examiner* — John K Fristoe, Jr.
*Assistant Examiner* — Andrew J Rost
(74) *Attorney, Agent, or Firm* — Cantor Colburn LLP

(57) ABSTRACT

The invention relates to a locking device for a lock opening which is arranged in a wall between a first and a second recipient, said lock opening comprising a blocking element, which is arranged in the inner chamber of the first recipient, and a counter-plate which is associated with the blocking element. A first magnet device is provided in an area of the counter-plate and a second magnet device, which is associated with the first magnet device, is provided in the region of the blocking element. In order to close and/or open the locking device by means of the first and second magnet device, a positive and/or negative contact pressure can be produced between the blocking element and the counter-plate.

13 Claims, 3 Drawing Sheets

Section A-A

(56) References Cited

U.S. PATENT DOCUMENTS

| | | | |
|---|---|---|---|
| 4,747,577 A * | 5/1988 | Dimock | 251/158 |
| 5,147,168 A * | 9/1992 | Suwa et al. | 414/217 |
| 5,379,984 A | 1/1995 | Coad et al. | |
| 5,820,104 A * | 10/1998 | Koyano et al. | 251/326 |

FOREIGN PATENT DOCUMENTS

| | | |
|---|---|---|
| DE | 39 41 502 | 6/1990 |
| EP | 1172456 A1 | 1/2002 |
| JP | 53137334 | 10/1978 |
| JP | 62-283282 | 12/1987 |
| JP | 62283282 | 12/1987 |
| JP | 63083468 | 4/1988 |
| JP | 01-100965UI | 7/1989 |
| JP | 01100965 | 7/1989 |
| JP | 2163377 A | 6/1990 |
| JP | 3046414 | 7/1991 |
| JP | 10332007 A | 12/1998 |
| JP | 11173443 A | 6/1999 |
| JP | 11193872 | 7/1999 |
| JP | 2003166661 A | 6/2003 |

OTHER PUBLICATIONS

JP OA 2007-526242 dtd Aug. 4, 2011 (English Translation).
English Translation of DE OA 10 2004027 752.4 dtd Nov. 6, 2012.
English Translation of JP Decision of Grant 2007-526242 dated Jun. 7, 2012.

* cited by examiner

FIG. 1  Section A-A

LOCKING DEVICE

TECHNICAL FIELD OF THE INVENTION

The invention relates to a lock device.

BRIEF DISCUSSION OF RELATED ART

Problems frequently occur in lock valves of vacuum chambers, especially for so-called in-line installations for substrate coating, during sealing of the lock-valve flap with respect to the receptacle. An important influencing factor in lock valves with lock-valve flaps that can be pivoted is deformation, especially twisting of the pivot shaft and the lock-valve flap when the flap presses against the receptacle in the closed state of the lock valve. The consequence of the resulting deformations is non-uniform pressure of the lock-valve flap on an elastic sealing element enclosing the lock opening, which means that the minimum pressure force necessary for reliable sealing is not ensured along the sealing element at all locations. A common, but demanding and costly concept to guarantee sufficient sealing consists of using components of very large dimensions, with which sufficiently high torque and corresponding pressure can be applied.

A device with a vacuum chamber and a lock valve provided on both sides of the vacuum chamber is known from DE-OS 3941 502. The valve plate has an elongated, parallelepiped shape, the valve plate being firmly connected to three bearing blocks. A shaft is passed through the bearing blocks, which is in turn connected to pivot levers and can be pivoted by a rack-and-pinion drive with a motor. The valve plate is held so that it can be tilted with respect to the lever about the fixed bearing, so that the sealing surfaces of the valve plate can be pressed onto the sealing surface on the housing of the vacuum chamber. However, it has been found that with this known lock valve, the highest sealing requirements cannot be achieved, because the required sealing ring is stressed too unevenly in the closed state and the sealing plate and drive shaft bend too much in the closed state. This problem occurs, in particular, if the valve plate has an extreme width/length ratio, as is typically required in in-line installations for flat large-surface substrates. A rotary lock for introduction or removal of a substrate from one treatment chamber to an adjacent one or from the atmospheric space into a chamber of lower pressure is also already known from DE 4203 473 A1, with a gate-like valve plate held in fixed bearings and a closure motor effectively connected to it and with a frame-like sealing element enclosing the lock opening. The valve plate is connected in a valve bar extending roughly parallel to it through at least one elastically deformable intermediate element, whereby the valve bar in turn has two diametrically opposite bearing pins that are connected to rotate in unison with drive motors provided outside of the chamber. The valve bar is designed with a rigid profile. A drawback of this lock is the high design expense and the difficulty of excluding particle contamination due to torsion of the valve plate.

A lock valve with a valve element through which a long narrow slit extends is known from U.S. Pat. No. 5,379,984. A valve plate that tapers to a narrow sealing contact surface is arranged on an opening side of the slit. A movable sealing element is provided in order to mount an expanded hose on the contact surface as sealing membrane. Since the sealing element is connected to a pivot axis, it is difficult, in this already known valve device, to guarantee uniform pressure along the opening course. This lock valve can therefore only withstand the pressure difference between the vacuum and atmospheric pressure, if the valve arranged at atmospheric pressure acts to support the closing force in the closure direction of the valve flap.

A flap arrangement with a pivot bearing for a vacuum chamber is also known from U.S. Pat. No. 6,263,542 B1. The flap element is disconnected from the pivot bearing by an expensive flexible connection, for example spring-loaded. Non-uniform pressure on the seal, which could lead to leaks, is supposed to be avoided with it.

BRIEF SUMMARY OF THE INVENTION

The task of the present invention is to devise a generic lock device with which simple and reliable sealing of a lock opening arranged in a wall can be achieved.

According to this invention, a first magnetic device is provided in an area of a counterplate in a lock device for a lock opening arranged in a wall between the first and second receptacle, with a blocking device arranged in the interior of the first receptacle and the counterplate assigned to the blocking device. A second magnetic device assigned to the first magnetic device is provided in an area of the blocking device. To close and/or open the lock opening, a positive and/or negative pressure force can be created between the blocking device and the counterplate by means of the first and second magnetic devices. According to the invention, the pressure force that produces sealing essentially acts locally at the sites at which sealing occurs. Because of this principle, no deformation of force-transferring design elements, such as a shaft or the like between the force generation site and the sealing site therefore occurs. Overall, the design elements can therefore be made very thin, preferably in a light-weight design. This has the additional advantage that only limited weights need be moved and a very dynamic system with short closing and opening times can therefore be achieved. The two receptacles are preferably vacuum chambers.

At least one of said magnetic devices has at least one switchable magnetic coil to produce a magnetic field; a closing and/or opening force can be generated or interrupted in a particularly simple manner.

A particularly cost-effective combination of switchability and a simple and robust design is achieved if one of the magnetic devices includes a ferromagnetic component and the other magnetic device has a switchable magnetic coil for generation of a magnetic field.

If one of the magnetic devices includes a first permanent magnet component to provide a current-free closure state and the other magnetic device includes a second permanent magnet component or a ferromagnetic component and at least one of the magnetic devices additionally has a switchable magnetic coil that generates an opening pulse by means of a magnetic opposing field, reliable closure of the lock opening is also attainable during any power outage.

Increased flexibility during use of the lock device according to the invention is achieved if the magnetic devices are designed so that they are capable of reliably sealing the blocking device with respect to atmospheric pressure, even if atmospheric pressure acts on the blocking device against the closure direction. A design of the magnetic devices that ensures such sealing even in a current-free closed state is particularly preferred here.

A non-uniformly-shaped closure opening, especially with a lock opening profile adapted to transporting substrates suspended vertically on a substrate carrier, is preferably provided, with which minimal gaps between the lock opening and parts moved through the opening can be achieved. This design reduces undesired overflow effects between adjacent chambers with different pressures and/or gas mixtures.

If the magnetic devices are arranged along lock opening so that the blocking device is free of torsion in the closed state of the lock opening, different pressures along the course of the lock opening, and thereby leaks or overflows are largely avoidable.

Depending on space conditions and variables, it is appropriate to use as the blocking device a pivotable flap or a slide device that can be positioned by means of a pivot device that can be positioned by means of a linear-movement device. The pivot device and the linear-movement device permit initiation and termination of a closing or opening movement, which can also preferably be automated and/or controlled.

As is known, a deformable sealing element, preferably a round cord ring, is provided in an area of the counterplate and/or the blocking device. Rubber-elastic round rings that can be reliably, cost effectively, and easily replaced are preferred.

An embodiment of the device in which the blocking device has a component formed from a ferromagnetic sheet is particularly preferred.

To improve the sealing function, it is advantageous that the blocking device be designed as a plate with limited bending rigidity, so that reliable sealing is assured by the permitted deformation of the blocking device in the closed state, even in the presence of larger manufacturing tolerances of the components involved.

BRIEF DESCRIPTION OF THE DRAWINGS

Additional embodiments and advantages of the invention will also be described by means of drawings, independently of their summary in the claims below and without restricting of generality.

In a strongly schematic depiction.

DETAILED DESCRIPTION OF THE INVENTION

Figure 1:
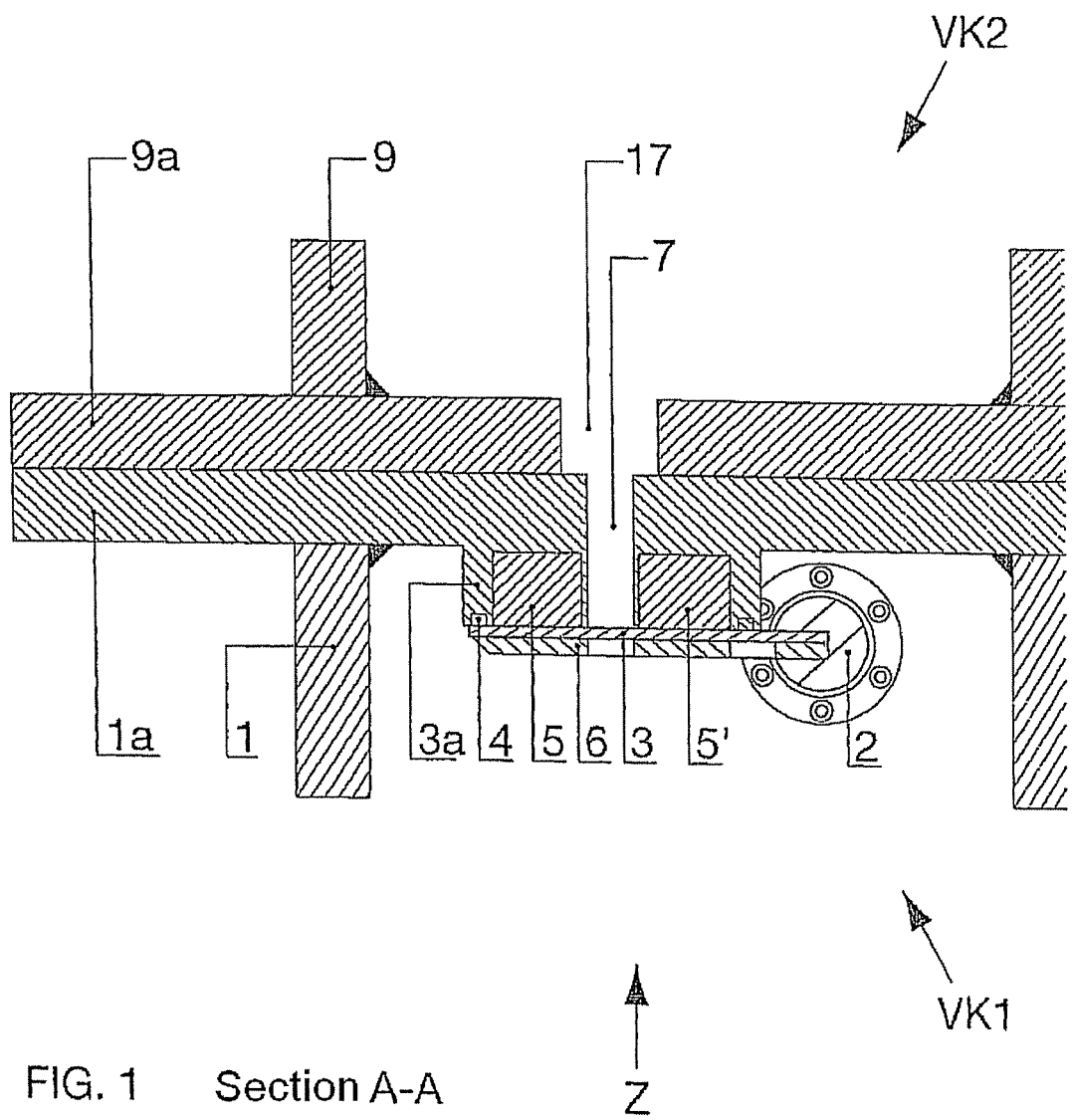
FIG. 1 shows a lock device according to the invention in a horizontal section.
Figure 2:
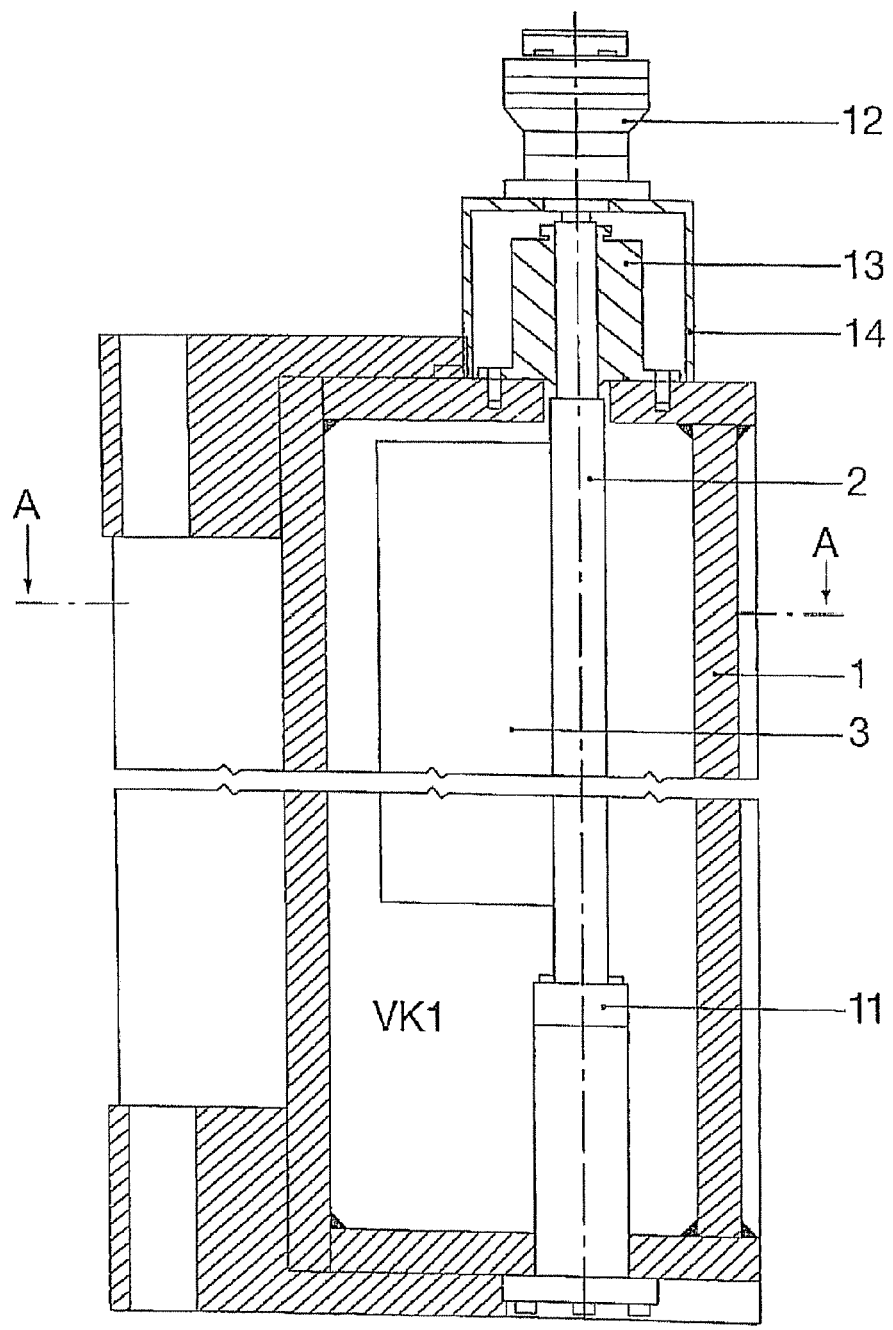
FIG. 2 shows a lock device according to the invention in a vertical section.

A horizontal section A-A and a vertical section perpendicular to A-A of a lock device according to the invention for a lock opening arranged in a wall between a first and a second receptacle are shown in FIGS. 1 and 2. The receptacles are vacuum chambers. This type of lock device is advantageously used in so-called in-line systems for the production of substrates for flat displays. Typically, such substrates are about 1 mm thick, rectangular, with a size of 1000×1200 mm or more. The substrates are guided suspended in the in-line system along a linear or U-shaped path through a number of vacuum chambers, which can be separated from each other by locks. Because of the substrate dimensions, typical lock openings are characterized by an extreme length/width ratio. However, it is understood that the lock device according to the invention can also be used for other lock-opening profiles. The lock device according to the invention can be made from thin-walled and light components, and it is therefore particularly suited for automated substrate handling with a high throughput rate and correspondingly rapid cycling of the lock valves, since only limited weights must be moved.

In FIG. 1, a lock opening designed as a rectangular gap is arranged between a first vacuum chamber VK1 and a second vacuum chamber VK2, which, in the present case comprise a first gap area 7, which is assigned to vacuum chamber VK1, and a second gap area 17, which is assigned to vacuum chamber VK2. A wall formed from a connection flange 1a in vacuum chamber VK1 and a connection flange 9a of vacuum chamber VK2 extends between vacuum chambers VK1 and VK2, which are each connected to a chamber wall 1 and 9 of vacuum chamber VK1 and VK2. The lock opening can be closed by a blocking device designed as a rectangular flap 3 in cooperation with a counterplate 3a. The lock opening is enclosed in the area formed by the gap area 7 by the counterplate 3a. The counterplate 3a also has a deformable sealing element, preferably a rubber-elastic round cord ring that is deformed in the closed state and guarantees pressure-proof sealing.

In a development of the invention, the blocking device has a shape different from the rectangular shape, which is preferably adjusted to the lock-opening profile.

The valve 3 is arranged on a pivot shaft 2, which can be moved by a rotating union 13 with a pivot drive 12.

A bearing site 11 and a mount 14 are provided for mounting and bearing the pivot drive and pivot shaft. The pivot drive 12 is used to initiate and terminate closing and opening movements. A pneumatic cylinder is provided as pivot drive, it being understood that hydraulic or electric drives can also be considered.

A first magnetic device with switchable magnetic coils 5, 5' is provided according to the invention in an area of the counterplate 3a, and a second magnetic device 6 is assigned to the first magnetic device in the area of the blocking device. The second magnetic device 6 is designed as a ferromagnetic plate or strip arrangement 6 arranged on the back of the flap 3. During activation of the magnetic coils 5, 5' a pressure force is generated between the flap 3 and the coils 5, 5', i.e., between the locking device and the counterplate 3a.

It is understood that various embodiments of flap 3 are covered by the invention and, in particular, the flap 3 can be produced from a ferromagnetic sheet, preferably with limited bending rigidity. A sheet thickness between 0.5 and 10 mm, especially between 1 and 8 mm is preferred. In a ferromagnetic flap 3, the ferromagnetic plate 6 can be omitted, since the flap 3 itself represents the second magnetic device. A deformable sealing element can also be arranged as an alternative or in addition on plate 3.

Figure 3:
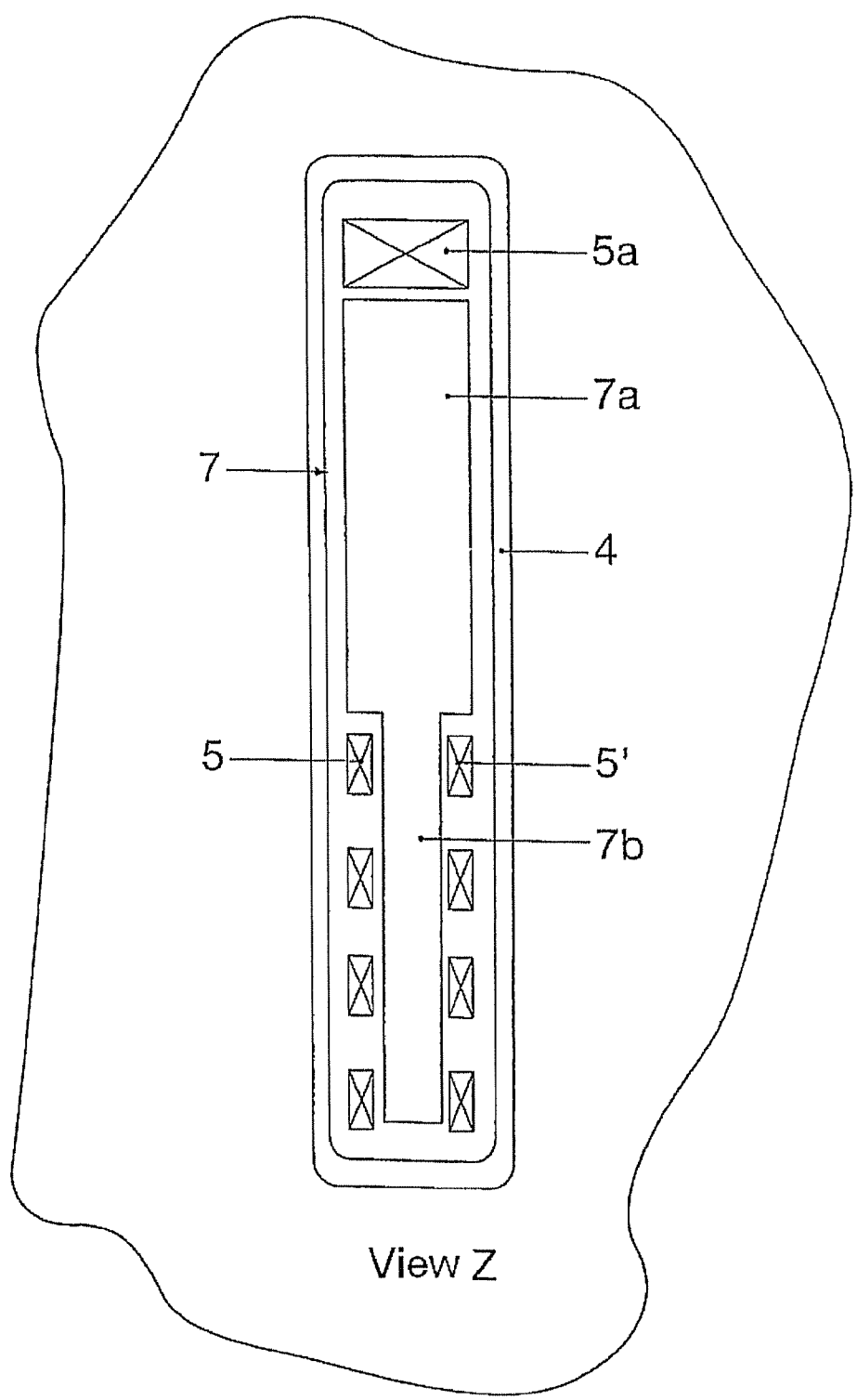
FIG. 3 shows a detailed view of the lock device with magnetic devices arranged along the lock opening.

A detailed view of a lock opening 7 with an open flap with magnetic devices 5, 5', 5a arranged along the opening of the lock opening is shown in FIG. 3. The lock opening is an opening profile with a first gap area 7a and a second gap area 7b, the first gap area 7a having a larger width than the second gap area 7b. This lock-opening profile is adapted for transporting substrates suspended vertically on a substrate carrier. The magnetic devices 5, 5' enclose the second lock opening area 7b on both sides. The magnetic device 5a is arranged above the first lock opening area 7a for space reasons. The deformable sealing element 4, preferably a round cord ring, encloses the lock opening and the magnetic devices 5, 5' and 5a. It is understood that a different course of the sealing element is also embraced by the invention.

In the closed state, the magnetic devices are arranged along the lock opening, so that the blocking device is free of torsion and is pressed against the sealing element 4 with sufficient pressure force.

The magnetic devices are also designed so that stipulated values of the pressure force exerted by the blocking device on the sealing element are attainable.

In a development of the invention, the switchable magnetic device is preferably designed as a one-part magnetic coil that encloses the lock opening along the opening, singly or multiply.

It is particularly favorable if a magnetic coil is attached by encapsulation with an appropriate vacuum-compatible casting compound in appropriately provided cavities of the components accommodating the coil. Epoxy resins, such as Araldite or similar substances, can be used for this purpose.

In a preferred embodiment of the invention, one of the magnetic devices includes a permanent-magnet component. The other magnetic device can also include a permanent-magnet component. A current-free closed state of the lock open can be achieved with this. At least one of the magnetic devices then has a switchable magnetic coil with which an opposing magnetic field can be generated. An opening pulse or a negative pressure force can therefore be generated between the blocking device and the counterplate. It is particularly preferred if the permanent magnetic devices are laid out for a reliable current-free closed state relative to atmospheric pressure, even if the atmospheric pressure acts on the blocking device against the closure direction.

In another embodiment of the invention, both magnetic devices include a permanent magnetic component, so that a current-free closed state of the lock opening can be produced. A drive shaft is also provided with which closing and opening movements can be initiated and terminated. It is understood that the torque available from the drive shaft must be sufficient to overcome the attraction force between the permanent magnets and the two magnetic devices during an opening movement.

Whereas it was assumed in the preceding description that both receptacles are vacuum chambers, it is understood that variants in which the blocking device is arranged on the separation site between one receptacle and an area with permanent atmospheric pressure are also covered by the invention.

The invention claimed is:

1. A lock device for a lock opening arranged in a wall between a first and second receiver with a blocking device arranged in an internal space of the first receiver, or for a lock opening with a blocking device arranged at a separation site between a receiver and an area with permanent atmospheric pressure, and a counterplate allocated to the blocking device, in which a first magnetic device is provided in an area of the counterplate and a second magnetic device allocated to the first magnetic device in an area of the blocking device, and for closure of the lock opening by means of the first and second magnetic device, a positive pressure force is generable between the blocking device and counterplate, wherein the first magnetic device is designed as a switchable magnetic coil that encloses the lock opening along an opening trend once or repeatedly, wherein the coil is positioned to be pressed by the blocking device and is attached by encapsulation with a vacuum compatible casting compound in provided cavities of the components housing the coil.

2. The device according to claim 1, wherein one of the magnetic devices includes a ferromagnetic component and that the other magnetic device is the switchable magnetic coil for generation of a magnetic field.

3. The device according to claim 1, wherein to guarantee current-free closure of the lock opening one of the magnetic devices includes a first permanent magnetic component, the other magnetic device includes a second permanent magnetic component and at least one of the magnetic devices has the switchable magnetic coil for generation of an opening pulse by means of an opposing magnetic opposing field.

4. The device according to claim 3, wherein the magnetic devices are designed for current-free closed state with respect to atmospheric pressure.

5. The device according to claim 1, wherein a non-uniform lock opening with a lock-opening profile adapted for transporting substrates suspended vertically on a substrate carrier is provided.

6. The device according to claim 1, wherein the magnetic devices are arranged along the lock opening, so that the blocking device is free of torsion in the closed state of the lock opening.

7. The device according to claim 1, wherein a flap pivotable by means of a pivot device is provided as a blocking device.

8. The device according to claim 7, wherein the pivot device can be operated hydraulically, pneumatically, and/or electromechanically.

9. The device according to claim 1, wherein a slide device with a slide plate positionable by means of a linear movement device is provided as the blocking device.

10. The device according to claim 9, wherein the linear movement device can be driven hydraulically, pneumatically, and/or electromechanically.

11. The device according to claim 1, wherein a deformable sealing element is provided in an area of the counterplate and/or in the blocking device.

12. The device according to claim 1, wherein the lock opening includes an varying diameter or width along a length of the opening.

13. The device according to claim 1, wherein the casting compound is an epoxy resin.

* * * * *